(12) United States Patent
Ogawa et al.

(10) Patent No.: US 9,899,506 B2
(45) Date of Patent: Feb. 20, 2018

(54) SEMICONDUCTOR DEVICE

(71) Applicant: Panasonic Intellectual Property Management Co., Ltd., Osaka (JP)

(72) Inventors: Masahiro Ogawa, Osaka (JP); Masahiro Ishida, Osaka (JP); Daisuke Shibata, Kyoto (JP); Ryo Kajitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/381,120

(22) Filed: Dec. 16, 2016

(65) Prior Publication Data
US 2017/0098703 A1 Apr. 6, 2017

Related U.S. Application Data

(63) Continuation of application No. PCT/JP2015/003100, filed on Jun. 22, 2015.

(30) Foreign Application Priority Data

Jul. 2, 2014 (JP) .................................. 2014-136756

(51) Int. Cl.
*H01L 29/00* (2006.01)
*H01L 21/00* (2006.01)
(Continued)

(52) U.S. Cl.
CPC .... *H01L 29/7787* (2013.01); *H01L 21/02428* (2013.01); *H01L 21/02658* (2013.01);
(Continued)

(58) Field of Classification Search
CPC ............. H01L 29/7787; H01L 29/2003; H01L 29/205; H01L 29/045; H01L 29/7847;
(Continued)

(56) References Cited

U.S. PATENT DOCUMENTS 8,502,270 B2 * 8/2013 Shimizu .............. H01L 29/1075
257/187
8,816,408 B2 * 8/2014 Makiyama ........ H01L 29/66462
257/280
(Continued)

FOREIGN PATENT DOCUMENTS

| JP | 9-180998 | 7/1997 |
|----|----------|--------|
| JP | 2010-183026 | 8/2010 |
| JP | 2011-151398 | 8/2011 |

OTHER PUBLICATIONS

International Search Report of PCT application No. PCT/JP2015/003100 dated Aug. 25, 2015.

*Primary Examiner* — Nikolay Yushin
(74) *Attorney, Agent, or Firm* — McDermott Will & Emery LLP

(57) ABSTRACT

Provided is a semiconductor device in which electron mobility is improved by applying sufficiently large tensile stress in a predetermined direction without occurrence of cracks in a nitride semiconductor. The semiconductor device includes: substrate (101), electron transit layer (103) that is disposed on substrate (101) and is formed by GaN; and electron supply layer (104) that is disposed on electron transit layer (103) and is formed by AlGaN. A coefficient of thermal expansion of substrate (101) is different between a first direction in a main surface of substrate (101) and a second direction that is perpendicular to the first direction in the main surface, and tensile stress occurs in electron transit layer (103).

13 Claims, 4 Drawing Sheets

(51) Int. Cl.
*H01L 29/778* (2006.01)
*H01L 29/20* (2006.01)
*H01L 29/205* (2006.01)
*H01L 29/04* (2006.01)
*H01L 21/02* (2006.01)
*H01L 29/78* (2006.01)

(52) U.S. Cl.
CPC ........ *H01L 29/045* (2013.01); *H01L 29/2003* (2013.01); *H01L 29/205* (2013.01); *H01L 29/7847* (2013.01)

(58) Field of Classification Search
CPC ......... H01L 21/02658; H01L 21/02428; H01L 21/02565; H01L 21/02433
See application file for complete search history.

(56) References Cited

U.S. PATENT DOCUMENTS

| | | |
|---|---|---|
| 9,142,623 B2 * | 9/2015 | Sasaki ................... C30B 29/16 |
| 2006/0175618 A1 | 8/2006 | Ishida |
| 2010/0244104 A1 * | 9/2010 | Makiyama ........ H01L 29/66462 |
| | | 257/279 |
| 2011/0315998 A1 | 12/2011 | Hashimoto et al. |
| 2012/0205718 A1 * | 8/2012 | Shimizu .............. H01L 29/1075 |
| | | 257/194 |
| 2014/0239452 A1 * | 8/2014 | Sasaki ................... C30B 29/16 |
| | | 257/613 |

* cited by examiner

SEMICONDUCTOR DEVICE

FIELD OF THE INVENTION

The present disclosure relates to a semiconductor device, and particularly, to a semiconductor device having high carrier mobility.

DESCRIPTION OF THE RELATED ART

A high electron mobility transistor (hereinafter, referred to as "HEMT") is a device that uses a high-concentration two-dimensional gas, which occurs at a hetero junction interface, as a channel. The HEMT, which is formed by a nitride semiconductor such as gallium nitride (GaN), aluminum nitride (AlN), indium nitride (InN), or a mixed crystal thereof, can generate a two-dimensional gas in which a carrier concentration is as high as $1\times10^{19}$ cm$^{-3}$ or greater and electron mobility is high, at a hetero junction interface due to spontaneous polarization and piezo polarization of the nitride semiconductor even in an un-doped state. Accordingly, it is possible to obtain a transistor in which on-resistance is low and which operates with a large current.

As a method of increasing electron mobility in the HEMT, there is known a method of applying tensile stress to a channel. The reason for this is as follows. When applying the tensile stress to the channel, in a direction in which the tensile stress occurs, degeneration of a conduction band is solved, and thus an effective mass of electrons decreases.

When using a substrate formed by silicon (Si) or a substrate formed by gallium oxide ($\beta$-Ga$_2$O$_3$) as the nitride semiconductor, tensile stress occurs in the nitride semiconductor. This is because a coefficient of thermal expansion in silicon or gallium oxide is smaller than a coefficient of thermal expansion of the nitride semiconductor. Here, a configuration of using gallium oxide as a substrate for nitride semiconductor growth is described, for example, in PTL 1.

CITATION LIST

Patent Literature

PTL 1: Japanese Patent Unexamined Publication No. 2010-183026.

SUMMARY OF THE INVENTION

However, when a difference in a coefficient of thermal expansion between a constituent material of a substrate and the nitride semiconductor is excessively large, there is a problem that cracks occur in the nitride semiconductor during cooling after crystal growth.

The present disclosure has been made in consideration of the above-described problem, and an object thereof is to improve electron mobility by applying sufficiently large tensile stress in a predetermined direction without occurrence of cracks in the nitride semiconductor.

To accomplish the object, the present disclosure employs a semiconductor device configuration in which a coefficient of thermal expansion or a substrate density is made different between intersecting directions in a plane of a substrate for semiconductor growth.

According to an aspect of the present disclosure, there is provided a semiconductor device including: a substrate; an electron transit layer that is disposed on the substrate and is formed by a first nitride semiconductor; and an electron supply layer that is disposed on the electron transit layer and is formed by a second nitride semiconductor. A coefficient of thermal expansion of the substrate is different between a first direction in a main surface of the substrate and a second direction that is perpendicular to the first direction in the main surface, and tensile stress occurs in the electron transit layer.

According to another aspect of the present disclosure, there is provided a semiconductor device including: a substrate having a first density; an electron transit layer that is disposed on the substrate and is formed by a first nitride semiconductor; and an electron supply layer that is disposed on the electron transit layer and is formed by a second nitride semiconductor. The substrate includes plural regions having a second density that is smaller than the first density.

According to the aspects of the present disclosure, sufficiently large tensile stress is applied in a predetermined direction without occurrence of cracks in a nitride semiconductor, and thus it is possible to improve electron mobility.

Figure 1:
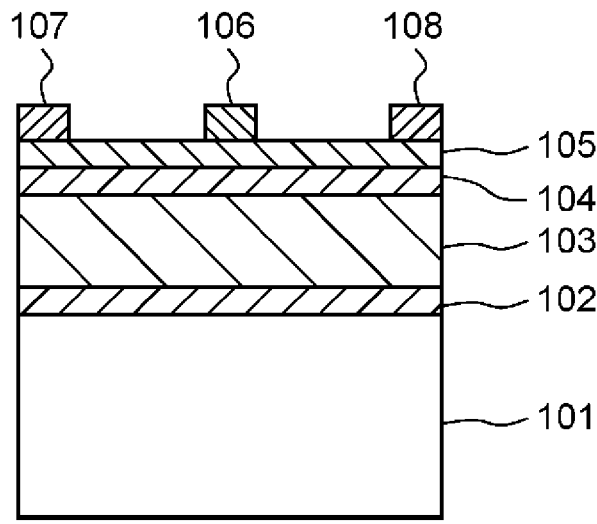
FIG. 1 is a cross-sectional view illustrating a semiconductor device according to a first exemplary embodiment.

DETAILED DESCRIPTION OF THE PREFERRED EMBODIMENTS (First Exemplary Embodiment)

First, description will be given of a gallium oxide (Ga$_2$O$_3$) substrate that is used in a first exemplary embodiment. Ga$_2$O$_3$ having a monoclinic structure has the following characteristics. A $\beta$-phase is a stable phase, and respective lattice constants of an a-axis, a b-axis, and a c-axis are 1.223 nm, 0.304 nm, and 0.580 nm which are different from each other. Gallium oxide also has anisotropy in a coefficient of thermal expansion. Specifically, a coefficient of thermal expansion in a [100] direction in crystal axes is $1.9\times10^6$/K to $5.3\times10^{-6}$/K, a coefficient of thermal expansion in a [010] direction is $5.9\times10^{-6}$/K to $8.6\times10^{-6}$/K, and a coefficient of thermal expansion in a [001] direction is $5.9\times10^{-6}$/K to $8.6\times10^{-6}$/K.

Typically, in a case where a semiconductor is subjected to crystal growth on a hetero substrate having a component different from that of the semiconductor, bending occurs due to a difference in a coefficient of thermal expansion between the substrate and the semiconductor in a temperature-lowering process (cooling process) after the crystal growth. In a case where a coefficient of thermal expansion of the semiconductor is greater than a coefficient of thermal expansion of the substrate, bending having a convex shape in a direction from the semiconductor toward the substrate occurs, and thus tensile stress is applied to the semiconductor. In contrast, in a case where the coefficient of thermal expansion of the semiconductor is smaller than the coefficient of thermal expansion of the substrate, bending having a convex shape in a direction from the substrate toward the semiconductor occurs, and thus compressive stress is applied to the semiconductor.

A β-$Ga_2O_3$ substrate (hereinafter, simply referred to as "$Ga_2O_3$ substrate"), in which a plane orientation of a main surface is (−201) plane, has a coefficient of thermal expansion different between a first direction in the main surface and a direction that is perpendicular to the first direction. For example, in a case where GaN, in which a main surface is a (0001) plane, that is, a c-plane, is subjected to crystal growth on the $Ga_2O_3$ substrate, a coefficient of thermal expansion in a direction perpendicular to the c-axis of GaN is $5.6 \times 10^{-6}$/K, and is greater than a coefficient of thermal expansion in a [100] direction in crystal axes of $Ga_2O_3$, and is smaller than a coefficient of thermal expansion in a [010] direction that is perpendicular to the [100] direction of $Ga_2O_3$. According to this, in GaN that is grown on $Ga_2O_3$, so-called uniaxial stress, in which tensile stress and compressive stress are mixed together in the c-plane, occurs. Furthermore, a negative symbol (−) in a Miller index representing a plane orientation or a crystal axis conveniently indicates inversion of any one index that continues from the symbol.

FIG. 1 illustrates a cross-sectional configuration of high electron mobility transistor (HEMT) that is a semiconductor device according to this exemplary embodiment.

As illustrated in FIG. 1, the semiconductor device according to this exemplary embodiment includes $Ga_2O_3$ substrate 101, buffer layer 102 that is disposed on a main surface of $Ga_2O_3$ substrate 101 and is formed by GaN, electron transit layer 103 that is disposed on the buffer layer 102 and is formed by un-doped GaN, electron supply layer 104 that is disposed on electron transit layer 103 and is formed by un-doped AlGaN, and cap layer 105 that is disposed on electron supply layer 104 and is formed by GaN. Hereinafter, a stacking structure of the semiconductor as described above may be referred to as an HEMT structure. In addition, a structure, which includes electron transit layer 103 and electron supply layer 104 disposed on electron transit layer 103 on an upper side of $Ga_2O_3$ substrate 101, may be referred to as AlGaN/GaN structure.

Here, for example, the thickness of $Ga_2O_3$ substrate 101 is 650 μm, the thickness of buffer layer 102 is 30 nm, the thickness of electron transit layer 103 is 2 μm, the thickness of electron supply layer 104 is 50 nm, and the thickness of cap layer 105 is 20 nm. In addition, an Al content of AlGaN that forms electron supply layer 104 is, for example, 15%.

Gate electrode 106 is disposed on electron supply layer 104. Source electrode 107 and drain electrode 108 are disposed on an upper side of electron supply layer 104 and on both sides of gate electrode 106 with a predetermined interval from gate electrode 106. Gate electrode 106 has a stacking structure (not illustrated) of titanium (Ti), gold (Au), and palladium (Pd). Here, for example, the thickness of Ti is 10 nm, the thickness of Au is 100 nm, and the thickness of Pd is 100 nm. Source electrode 107 and drain electrode 108 have a stacking structure (not illustrated) of Ti, Al, and Ti. For example, the thickness of Ti is 20 nm, and the thickness of Al is 20 nm.

In addition, gate electrode 106, source electrode 107, and drain electrode 108 are disposed in such a manner that an electron transit direction (gate longitudinal direction) in electron transit layer 103 is parallel to a [−102] direction in crystal axes of $Ga_2O_3$.

An HEMT having a structure illustrated in FIG. 1 is prepared on $Ga_2O_3$ substrate 101 having a diameter of 5.08 cm (2 inches), and bending thereof is measured. Hereinafter, a direction from $Ga_2O_3$ substrate 101 to electron transit layer 103 is referred to as "upward direction", and a direction from electron transit layer 103 to $Ga_2O_3$ substrate 101 is referred to as "downward direction".

In a [010] direction in the $Ga_2O_3$ substrate, bending having an upwardly convex shape occurs, and the size thereof is 25 μm. Hereinafter, the upwardly convex shape is described as +25 μm by using a positive symbol. On the other hand, in a [−102] direction that is perpendicular to the [010] direction in the $Ga_2O_3$ substrate, bending having a downwardly convex shape occurs, and the size thereof is 15 μm. Hereinafter, the downwardly convex shape is described as −15 μm by using a negative symbol. That is, in electron transit layer 103, compressive stress occurs in a direction parallel to the [010] direction of the $Ga_2O_3$ substrate, and tensile stress occurs in a direction parallel to the [−102] direction. That is, a direction of an electron, which transits through electron transit layer 103, matches a direction in which the tensile stress occurs. Furthermore, an expression of "matching" includes a manufacturing error, and represents "substantial matching".

From more detailed investigation of the amount of bending in the $Ga_2O_3$ substrate and the HEMT structure on the $Ga_2O_3$ substrate, it can be seen that the amount of bending in an upward direction becomes maximum in the [010] direction, and the amount of bending in a downward direction becomes maximum in the [−102] direction. Hereinafter, a situation in which both of the tensile stress and the compressive stress occur in the same plane is defined as "uniaxial stress occurs".

Furthermore, as is the case with PTL 1, in a $Ga_2O_3$ substrate in which the main surface is a (100) plane or a plane that is inclined to the (100) plane by an angle of 2° to 4°, a coefficient of thermal expansion in the main surface is substantially uniform without depending on a direction. Accordingly, the uniaxial stress does not occur in the GaN crystal on the main surface.

Figure 2:
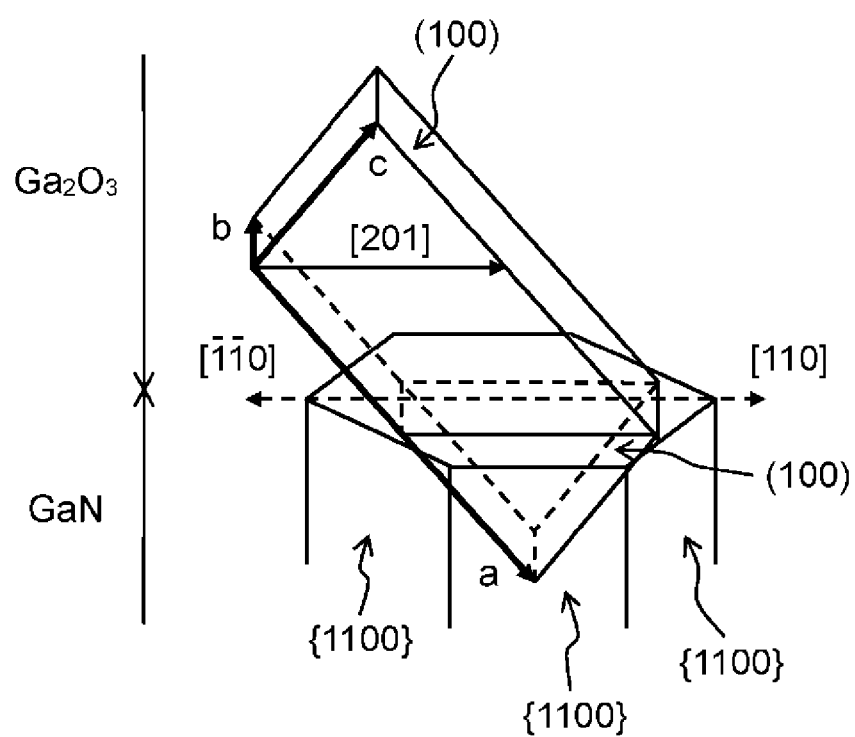
FIG. 2 is a schematic perspective view illustrating a relationship between a plane orientation of Ga$_2$O$_3$ that is a substrate material and a plane orientation of GaN that is a semiconductor material in the semiconductor device according to the first exemplary embodiment.

FIG. 2 illustrates a plane orientation relationship between $Ga_2O_3$ substrate 101 and electron transit layer 103 formed by GaN as illustrated in FIG. 1. As illustrated in FIG. 2, GaN that is a nitride semiconductor pertains to "hexagonal", and $Ga_2O_3$ pertains to "monoclinic" as described above.

Figure 3A:
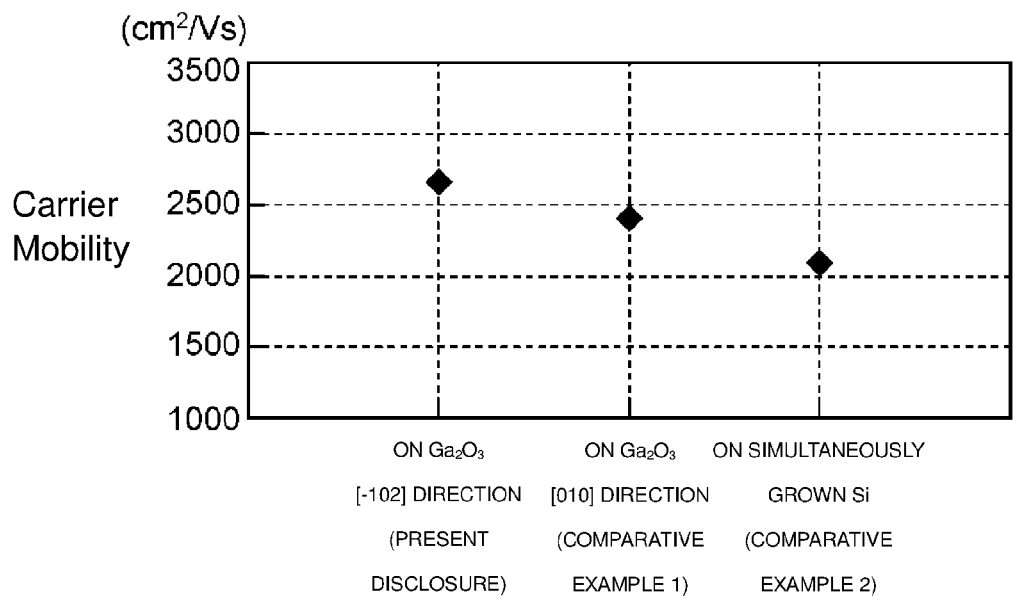
FIG. 3A is a graph illustrating carrier mobility in the semiconductor device according to the first exemplary embodiment.
Figure 3B:
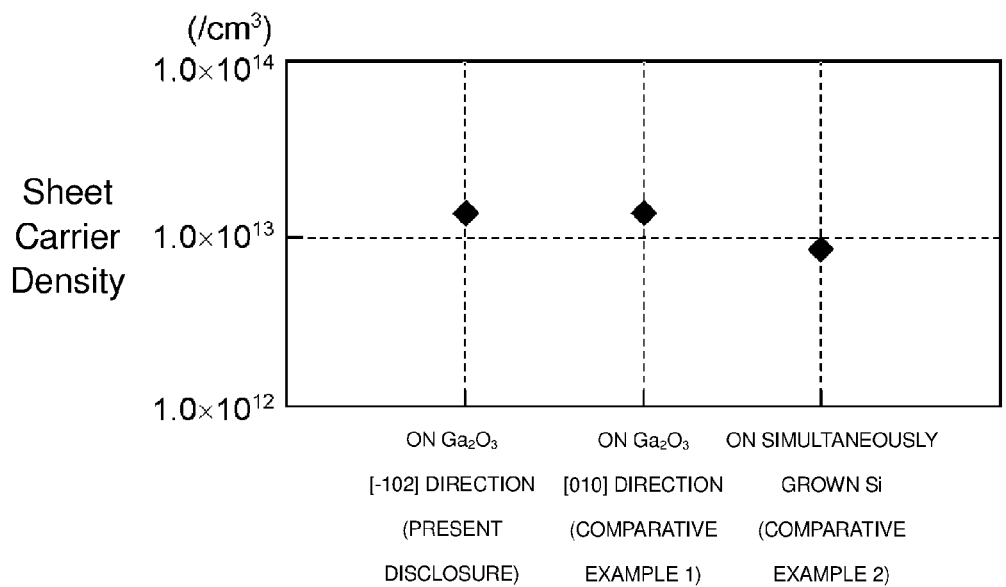
FIG. 3B is a graph illustrating a sheet carrier density in the semiconductor device according to the first exemplary embodiment.

FIG. 3A illustrates carrier mobility of an AlGaN/GaN structure which is measured by hall measurement. In addition, FIG. 3B illustrates a sheet carrier density of the AlGaN/GaN structure which is measured by the hall measurement. FIG. 3A also illustrates carrier mobility of the AlGaN/GaN structure in which an electrode is formed for electron transit in the [010] direction of the $Ga_2O_3$ substrate as Comparative Example 1, and carrier mobility of the AlGaN/GaN structure on an Si substrate in which strain in an in-plane direction is isotropic as Comparative Example 2. In addition, FIG. 3B also illustrates a sheet carrier density of the AlGaN/GaN structure in which an electrode is formed for electron transit in the [010] direction of the $Ga_2O_3$ substrate as Comparative Example 1, and a sheet carrier density of the AlGaN/GaN structure on the Si substrate in which strain in an in-plane direction is isotropic as Comparative Example 2.

As illustrated in FIG. 3A, in a case where an electron transits in the direction in the AlGaN/GaN structure formed on the $Ga_2O_3$ substrate (Comparative Example 1), the carrier mobility is greater than that of the AlGaN/GaN structure on the Si substrate (Comparative Example 2). In addition, the carrier mobility in a case where an electron transits in the [–102] direction of the $Ga_2O_3$ substrate of this exemplary embodiment is greater than the carrier mobility of the case where an electron transits in the [010] direction of the $Ga_2O_3$ substrate (Comparative Example 1) by approximately 20%. The reason for this difference is considered as follows. In electron transit layer 103, particularly, tensile stress occurs in an electron transit direction, and thus degeneration of a conduction band in the tensile stress occurring direction is solved. As a result, an effective mass of electrons decreases.

The carrier mobility is inversely proportional to the effective mass of carriers. Accordingly, when the effective mass of electrons decreases, mobility thereof increases. At this time, in electron supply layer 104, both tensile stress due to lattice mismatching with electron transit layer 103, and uniaxial stress due to a difference in a coefficient of thermal expansion between $Ga_2O_3$ substrate 101 and electron supply layer 104 occur. At this time, when the two kinds of stress are combined, a carrier density may vary. Furthermore, an evaluation target according to this exemplary embodiment is a sheet carrier density of an in-plane direction in the main surface of $Ga_2O_3$ substrate 101, and thus it is clear that orientation dependency does not occur in the sheet carrier density illustrated in FIG. 3B.

The magnitude of stress applied to electron transit layer 103 can be changed by changing a ratio between the thickness of $Ga_2O_3$ substrate 101 and the thickness of the HEMT structure formed on $Ga_2O_3$ substrate 101. For example, as buffer layer 102 in the HEMT structure is made to be thicker by a hydride vapor phase epitaxy (HVPE) method and the like with a constant thickness of $Ga_2O_3$ substrate 101, a coefficient of thermal expansion in electron transit layer 103 becomes predominant, and thus the uniaxial stress applied to electron transit layer 103 decreases. Similarly, even when substrate 101 is made to be thinner through polishing on a rear surface of $Ga_2O_3$ substrate 101, the uniaxial stress decreases. In contrast, when the HEMT structure is made to be thinner, or $Ga_2O_3$ substrate 101 is made to be thicker, a coefficient of thermal expansion of $Ga_2O_3$ substrate 101 becomes predominant, and thus the uniaxial stress applied to electron transit layer 103 increases.

In this exemplary embodiment, a direction of an electron that transits through electron transit layer 103 in the HEMT structure is set to match the [–102] direction in the crystal axes of $Ga_2O_3$ substrate 101, but there is no limitation thereto. That is, when tensile stress is applied in an electron transit direction, the carrier mobility increases. Furthermore, it is needless to say that a direction in which an effect of the tensile stress is the greatest is a direction in which the amount of bending is greatest. However, the tensile stress becomes the cause for cracks, and thus it is preferable that stress that occurs in a direction different from the electron transit direction is relatively small tensile stress or compressive stress.

Furthermore, even in a substrate other than the $\beta$-$Ga_2O_3$ substrate in which a plane orientation of the main surface is [–201] plane as described in this exemplary embodiment, when using a substrate having the same characteristics as in the $\beta$-$Ga_2O_3$ substrate, the same effect can be attained.

As described above, according to this exemplary embodiment, the electron mobility in the semiconductor device is improved, and thus it is possible to realize high speed and low power consumption of the semiconductor device.

(Second Exemplary Embodiment)

Hereinafter, description will be given of the principle in which a substrate including a stress application portion in a second exemplary embodiment applies stress to the electron transit layer.

A substrate formed by sapphire (single crystal $Al_2O_3$) or silicon (Si) is irradiated with high-output laser light such as a condensed femtosecond laser, a crystal in the vicinity of a focal point of the laser light is melted, and a volume of a region irradiated with the laser in a crystal is expanded. When plural volume expanded regions as described above are formed in a substrate, stress occurs in the substrate, and thus it is possible to bend the substrate. Furthermore, the shape of the bending and the magnitude of the bending depend on laser irradiation conditions (an output, an interval, a depth, and the like). Accordingly, when bending, which has a convex shape in a direction (hereinafter, referred to as "upward direction") from a substrate for crystal growth to a semiconductor that is a crystal substance on the substrate, is provided, it is possible to apply compressive stress to the semiconductor. In contrast, when bending, which has a convex shape in a direction (hereinafter, referred to as "downward direction") from the semiconductor on the substrate to the substrate, is provided, it is possible to apply tensile stress to the semiconductor.

Figure 4:
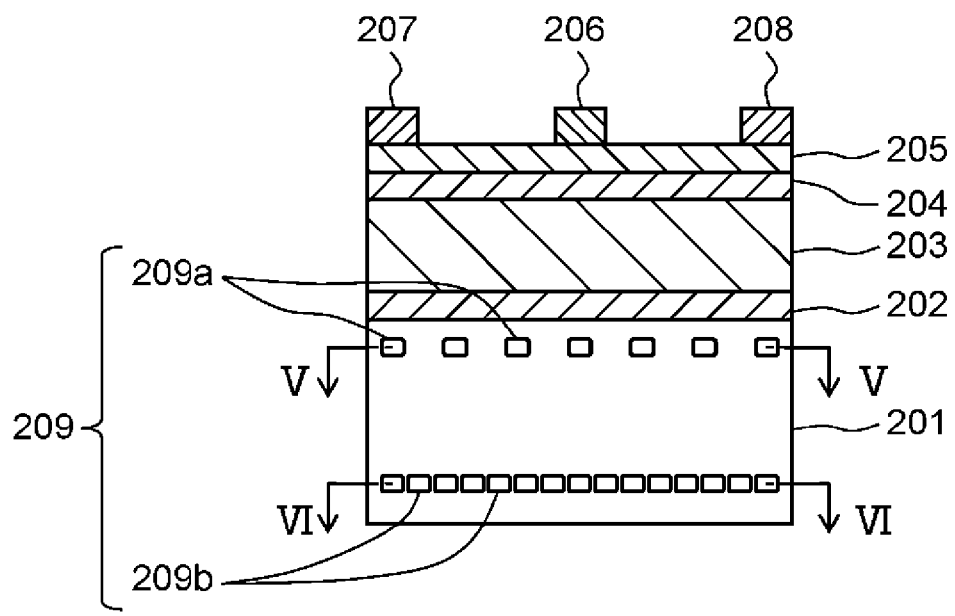
FIG. 4 is a cross-sectional view illustrating a semiconductor device according to a second exemplary embodiment.

FIG. 4 illustrates a cross-sectional configuration of a high electron mobility transistor (HEMT) that is a semiconductor device according to this exemplary embodiment.

As illustrated in FIG. 4, the semiconductor device according to this exemplary embodiment includes sapphire substrate 201 in which a (0001) plane of a plane orientation is set to a main surface, buffer layer 202 that is disposed on the main surface of sapphire substrate 201 and is formed by GaN, electron transit layer 203 that is disposed on buffer layer 202 and is formed by un-doped GaN, electron supply layer 204 that is disposed on electron transit layer 203 and is formed by un-doped AlGaN, and cap layer 205 that is disposed on electron supply layer 204 and is formed by GaN.

In this exemplary embodiment, for example, the thickness of sapphire substrate 201 is 650 μm, the thickness of buffer layer 202 is 30 nm, the thickness of electron transit layer 203 is 2 μm, the thickness of electron supply layer 204 is 50 nm, and the thickness of cap layer 205 is 20 nm. In addition, an Al content of AlGaN that formes electron supply layer 204 is, for example, 15%.

Gate electrode 206 is disposed on an upper side of electron supply layer 204. Source electrode 207 and drain electrode 208 are disposed on an upper side of electron supply layer 204 and on both sides of gate electrode 206 with a predetermined interval from gate electrode 206. Gate electrode 206 has a stacking structure (not illustrated) of titanium (Ti), gold (Au), and palladium (Pd). Here, for example, the thickness of Ti is 10 nm, the thickness of Au is 100 nm, and the thickness of Pd is 100 nm. Source electrode 107 and drain electrode 108 have a stacking structure (not illustrated) of Ti, Al, and Ti. For example, the thickness of Ti is 20 nm, and the thickness of Al is 20 nm.

Stress application portions 209, which are plural regions formed through laser irradiation, are provided in an upper portion and in a lower portion of sapphire substrate 201. Among plural stress application portions 209, stress application portion 209a is formed in an upper portion (on a front surface side) of sapphire substrate 201, and stress application portion 209b is formed in a lower portion (rear surface side) of sapphire substrate 201.

A volume of plural stress application portions 209 is expanded due to laser irradiation, and thus a density thereof is smaller than a density of sapphire substrate 201. Sapphire substrate 201 having a diameter of 5.08 cm (2 inches) is designed in such a manner that bending in an a-axis direction and bending in an m-axis direction perpendicular to the a-axis direction respectively become −30 μm and +5 μm due to plural stress application portions 209.

Figure 5:
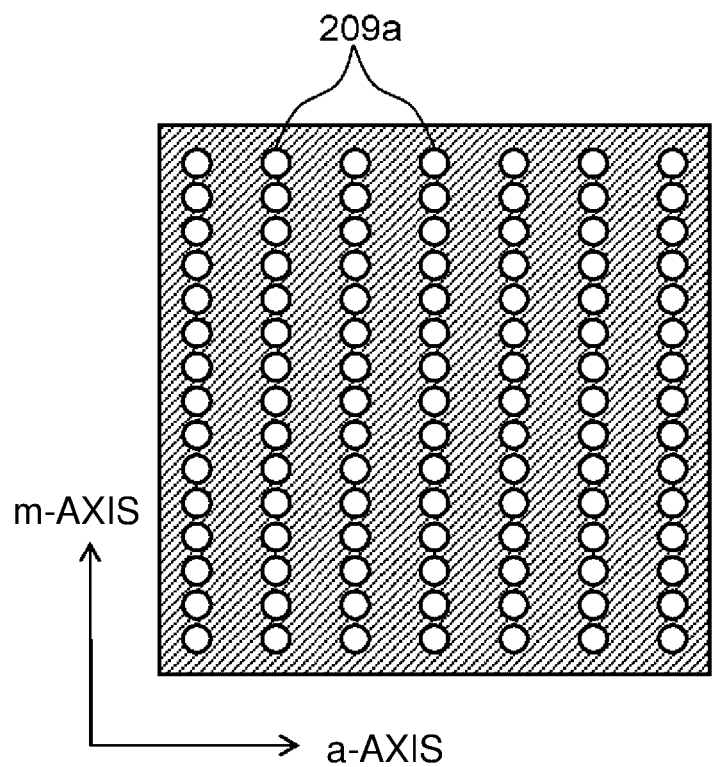
FIG. 5 is a cross-sectional view taken along line V-V in FIG. 4.

For example, the above-described structure can be obtained by a configuration illustrated in FIG. 4 and FIG. 5. FIG. 5 illustrates an in-plane cross-sectional configuration on a front surface side of sapphire substrate 201, and FIG. 6 illustrates an in-plane cross-sectional configuration on a rear surface side of sapphire substrate 201.

As illustrated in FIG. 5, plural stress application portions 209a on a front surface side are formed as laser irradiation rows which are disposed with an interval, and are more densely disposed in the m-axis direction in comparison to the a-axis direction. In the m-axis direction, stress application portions 209a may be formed to come into contact with each other, that is, may be formed integrally with each other. According to this configuration, volume expansion of the m-axis direction in the vicinity of the surface of sapphire substrate 201 becomes predominant, and thus it is possible to bend substrate 201 with an upwardly convex shape in the m-axis direction.

Figure 6:
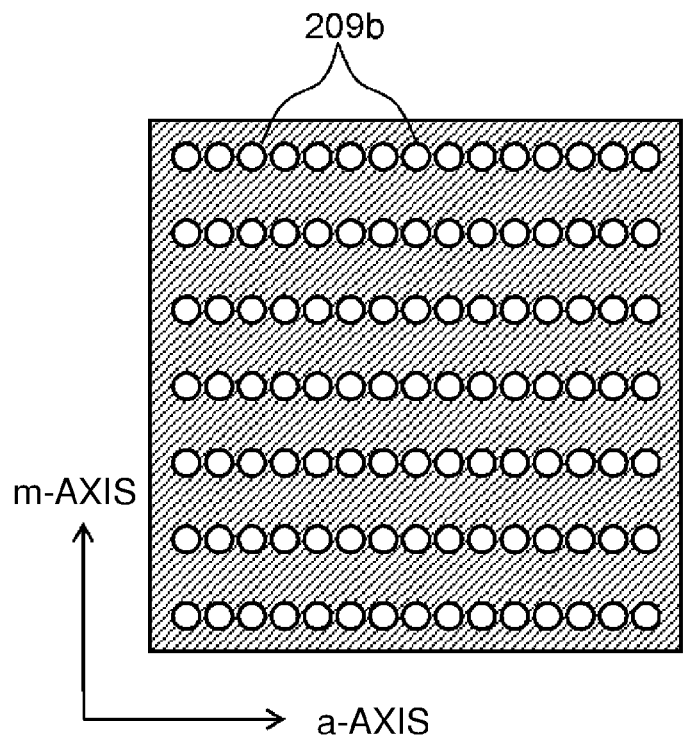
FIG. 6 is a cross-sectional view taken along line VI-VI in FIG. 4.

In addition, as illustrated in FIG. 6, plural stress application portions 209b on a rear surface side of sapphire substrate 201 are formed in laser irradiation rows which are disposed with an interval, and are more densely disposed in the a-axis direction in comparison to the m-axis direction. In the a-axis direction, stress application portions 209b may be formed to come into contact with each other, that is, may be formed integrally with each other. According to this configuration, volume expansion of the a-axis direction in the vicinity of the rear surface of sapphire substrate 201 becomes predominant, and thus it is possible to bend substrate 201 with a downwardly convex shape in the a-axis direction.

As described above, when an interval between plural regions irradiated with a laser is made to be changed in accordance with an orientation of a crystal axis, it is possible to allow uniaxial stress to occur. In addition, when a region of two or greater layers, which are different in a depth in sapphire substrate 201, is irradiated with a laser, it is possible to change the magnitude of bending in two directions and the directions in an arbitrary manner.

In this exemplary embodiment, gate electrode 206, source electrode 207, and drain electrode 208 are disposed in such a manner that an electron transit direction (gate longitudinal direction) in electron transit layer 203, to which stress is applied as described above, becomes parallel to the a-axis of sapphire substrate 201. According to this configuration, electron transit layer 203 receives tensile stress due to bending having a downwardly convex shape. That is, a direction of an electron that transits through electron transit layer 203 matches a direction in which the tensile stress is applied. In addition, an expression of "matching" includes a manufacturing error, and represents "substantial matching".

Figure 7:
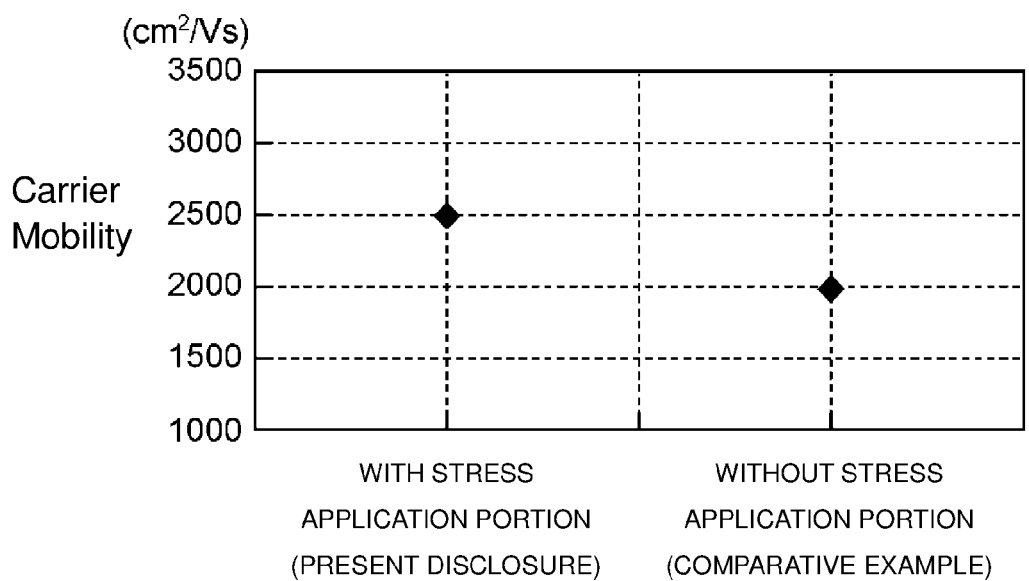
FIG. 7 is a graph illustrating carrier mobility in the semiconductor device according to the second exemplary embodiment.

FIG. 7 illustrates carrier mobility measured by hall measurement. FIG. 7 also illustrates carrier mobility in a case where stress application portion 209 is not provided to sapphire substrate 201 as a comparative example. As illustrated in FIG. 7, from measurement of the carrier mobility in the a-axis direction, the carrier mobility of the HEMT according to this exemplary embodiment shows a value higher than carrier mobility of HEMT according to comparative example, in which the stress application portion is not provided, by approximately 20%.

The reason for this difference is that when tensile stress is applied to a crystal substance, degeneration of a conduction band in the stress occurring direction is solved, and thus an effective mass of electrons decreases. The carrier mobility is inversely proportional to the effective mass of carriers. Accordingly, when the effective mass of electrons decreases, mobility thereof increases.

In this exemplary embodiment, the tensile stress is applied in the a-axis direction of sapphire substrate 201, but the tensile stress application direction is not limited to the a-axis direction, and the same effect can be attained as long as the tensile stress is applied in the electron transit direction.

In addition, stress that is different between the a-axis direction and the m-axis direction in sapphire substrate 201 is applied, but tensile stress may be applied with respect to both of the directions. However, the tensile stress becomes the cause for cracks, and thus it is preferable that stress that occurs in a direction different from the electron transit direction is relatively small tensile stress or compressive stress.

In addition, stress application portion 209 may be formed through the laser irradiation before crystal growth for formation of the HEMT structure or after the crystal growth, but it is preferable that stress application portion 209 is formed after the crystal growth. The reason for this preference is that when stress application portion 209 is formed before the crystal growth, stress may be mitigated in the subsequent crystal growth. Furthermore, it is preferable that stress application portion 209 is formed after an electrode forming process rather than before the electrode forming process. The reason for this preference is that in a state in which stress is applied to sapphire substrate 201, that is, in a state in which bending occurs in substrate 201, it is difficult to perform a minute process, and a risk such as a decrease in a yield ratio increases.

In addition, in this exemplary embodiment, sapphire (single crystal $Al_2O_3$) is used for a substrate for crystal growth, but a constituent material of the substrate is not limited to sapphire, and may be silicon (Si), gallium nitride (GaN), or gallium oxide ($Ga_2O_3$). The reason for this is as follows. A method of allowing stress to occur through laser irradiation uses a principle in which a crystal in a portion irradiated with laser light is modified and a volume of the portion is expanded. Accordingly, it is possible to control the stress through control of a laser-light irradiation density, a laser-light irradiation depth, and the like regardless of a coefficient of thermal expansion of the substrate, and the like.

As described above, according to this exemplary embodiment, electron mobility in a semiconductor device is improved, and thus it is possible to realize high speed and low power consumption of the semiconductor device.

Hereinbefore, the semiconductor device according to the present disclosure has been described on the basis of the exemplary embodiments. However, the present disclosure is not limited to the exemplary embodiments, and may be executed in various aspects in a range not departing from the gist of the present disclosure. For example, the HEMT structure is not limited to the structures in the exemplary embodiments, and a component and the like in the AlGaN/GaN structure are not limited to the configurations in the exemplary embodiments. In addition, a combination of the first exemplary embodiment and the second exemplary embodiment is also possible.

INDUSTRIAL APPLICABILITY

The semiconductor device according to the present disclosure is effective as a semiconductor device having high carrier mobility, and the like.

REFERENCE MARKS IN THE DRAWINGS

101 β-$Ga_2O_3$ substrate ($Ga_2O_3$ substrate)
102 buffer layer
103 electron transit layer
104 electron supply layer
105 cap layer
106 gate electrode
107 source electrode
108 drain electrode
201 sapphire substrate
202 buffer layer
203 electron transit layer
204 electron supply layer
205 cap layer
206 gate electrode
207 source electrode
208 drain electrode
209 stress application portions (plural regions)
209a stress application portion (first region)
209b stress application portion (second region)

The invention claimed is:

1. A semiconductor device, comprising:
a substrate;
an electron transit layer that is disposed on the substrate and is formed by a first nitride semiconductor; and
an electron supply layer that is disposed on the electron transit layer and is formed by a second nitride semiconductor,
wherein a coefficient of thermal expansion of the substrate is different between a first direction in a main surface of the substrate and a second direction that is perpendicular to the first direction in the main surface,
a first tensile stress occurs in the electron transit layer, and the first tensile stress occurs in a direction in which an electron transits in the electron transit layer.

2. The device according to claim 1, wherein in the electron transit layer, a second tensile stress that is smaller than the first tensile stress, or compressive stress occurs in a direction different from the direction in which the first tensile stress occurs.

3. The device according to claim 1, further comprising:
a gate electrode, a source electrode, and a drain electrode which are disposed on an upward side of the electron supply layer with an interval from each other in a direction in which tensile stress is applied.

4. The device according to claim 1, wherein the substrate is formed by gallium oxide.

5. The device according to claim 4, wherein the direction in which an electron transits in the electron transit layer matches a [−102] direction in a crystal axis of the gallium oxide.

6. A semiconductor device, comprising:
a substrate having a first density;
an electron transit layer that is disposed on the substrate and is formed by a first nitride semiconductor; and
an electron supply layer that is disposed on the electron transit layer and is formed by a second nitride semiconductor,
wherein the substrate includes a plurality of regions having a second density that is smaller than the first density,
each of the plurality of regions includes a plurality of first regions and a plurality of second regions, and
the second region is formed on a rear surface side of the substrate in comparison to the first region.

7. The device according to claim 6, wherein tensile stress occurs in a direction in which an electron transits in the electron transit layer.

8. The device according to claim 6, wherein the plurality of regions are volume expanded regions which are formed with laser irradiation.

9. The device according to claim 6, wherein the substrate is formed by sapphire, silicon, gallium nitride, or gallium oxide.

10. The device according to claim 6, wherein the plurality of first regions are more densely formed in a second direction, which is perpendicular to a first direction of a main surface in the substrate, in the main surface in comparison to the first direction of the main surface.

11. The device according to claim 10, wherein the plurality of second regions are more densely formed in the first direction in comparison to the second direction.

12. The device according to claim 6, wherein a first tensile stress is applied to the electron transit layer.

13. The device according to claim 12, wherein in the electron transit layer, a second tensile stress that is smaller than the first tensile stress, or compressive stress occurs in a direction different from the direction in which the first tensile stress occurs.

* * * * *